United States Patent [19]
Levine

[11] Patent Number: 5,589,704
[45] Date of Patent: Dec. 31, 1996

[54] ARTICLE COMPRISING A SI-BASED PHOTODETECTOR

[75] Inventor: Barry F. Levine, Livingston, N.J.

[73] Assignee: Lucent Technologies Inc., Murray Hill, N.J.

[21] Appl. No.: 379,422

[22] Filed: Jan. 27, 1995

[51] Int. Cl.$^6$ ................................................ H01L 31/0232
[52] U.S. Cl. .......................... 257/436; 257/437; 257/443; 257/461; 257/464
[58] Field of Search .................................. 257/432, 436, 257/437, 443, 448, 458, 461, 464

[56] References Cited

U.S. PATENT DOCUMENTS 4,989,972  2/1991  Braun ........................................ 257/437

OTHER PUBLICATIONS

"A Gigabit-Rate Five-Highway GaAs OE-LSI Chipset for High-Speed Optical Interconnections Between Modules or VLSI's", by N. Yamanaka et al., *IEEE Journal on Selected Areas in Communications*, vol. 9, No. 5, Jun. 1991, pp. 689–697.

"Comparison of the Picosecond Characteristics of Silicon and Silicon-on-sapphire Metal-semiconductor-metal Photodiodes", by C. Wang et al., *Applied Physics Letters*, vol. 64 (26), 27 Jun. 1994, pp. 3578–3580.

"140-GHz Metal-semiconductor-metal Photodetectors on Silicon-on-insulator Substrate with a Scaled Active Layer", by M. Y. Liu et al., *Applied Physics Letters*, vol. 65, No. 7, 15 Aug. 1994, pp. 887–888.

"Improved Performance of Quantum Well Infrared Photodetectors Using Random Scattering Optical Coupling", by G. Sarusi et al., *Applied Physics Letters*, vol. 64, No. 8, 21 Feb. 1994, pp. 960–962.

"Statistical Ray Optics", by E. Yablonovitch, *Journal of Optical Society of America*, vol. 72, No. 7, Jul. 1982, pp. 899–907.

"Limiting Efficiency of Silicon Solar Cells", by T. Tiedje et al., *IEEE Transactions on Electron Devices*, vol. ED–31, No. 5, May 1984, pp. 711–716.

*Primary Examiner*—Minhloan Tran
*Attorney, Agent, or Firm*—Eugen E. Pacher

[57] ABSTRACT

Si-based photodetectors according to the invention can have high speed (e.g., $\geq 1$ Gb/s) and high efficiency (e.g., >20%). The detectors include a relatively thin (e.g., <$0.5\alpha^{-1}$, where $\alpha^{-1}$ is the absorption length in Si of the relevant radiation) crystalline Si layer on a dielectric (typically $SiO_2$) layer, with appropriate contacts on the Si layer. Significantly, the surface of the Si layer is textured such that the radiation that is incident on the surface and transmitted into the Si layer has substantially random direction. The randomization of the propagation direction results in substantial trapping of the radiation in the Si layer, with attendant increased effective propagation length in the Si. Detectors according to the invention advantageously are integrated with the associated circuitry on a Si chip, typically forming an array of detectors.

8 Claims, 3 Drawing Sheets

ARTICLE COMPRISING A SI-BASED PHOTODETECTOR

FIELD OF THE INVENTION

This invention pertains to the field of semiconductor photodetectors, and articles that comprise such photodetectors, e.g., optical interconnect.

BACKGROUND OF THE INVENTION

Fast photodetectors are required for many applications, including optical interconnects and optical communications. In many cases it would be highly desirable to have available a monolithically integrated photodetector/receiver combination. Such a combination has been demonstrated by N. Yamanaka et at. (*IEEE Journal on Selected Areas in Communications*, Vol. 9(5), p. 689). The GaAs-based combination exhibited excellent performance using laser transmitters operating at 0.85 µm wavelength.

Those skilled in the art will recognize that a Si-based photodetector/receiver combination would be substantially less expensive than the prior art GaAs-based combination. Furthermore, more electronic functionality could typically be built into a Si-based combination than into a GaAs-based combination, due to the far greater maturity of Si technology. Unfortunately, Si has an indirect bandgap and thus has much weaker absorption for electromagnetic radiation than GaAs. For instance, radiation of wavelength $\lambda=0.85$ µm and 0.88 µm, respectively, has an absorption length $\alpha^{-1}=15$ µm and 20 µm in Si, compared to a respective absorption length of about 1 µm in GaAs.

The long absorption length of electromagnetic radiation in crystalline Si produces two problems. First, since the depletion width (and thus the carrier collection length) in a Si-based photodetector (e.g., a metal-semiconductor-metal detector) will only be a few microns, the quantum efficiency $\eta$ of the detector will be quite low. Second, the photocarrier generated below the depletion region will be collected by diffusion rather than field induced drift, resulting in a slow detector. Thus, prior art Si-based photodetectors typically can not simultaneously have high (e.g., $\geq 20\%$) quantum efficiency and high (e.g., $\geq 1$ Gb/s) speed. For instance, a prior art Si MSM (metal-semiconductor-metal) detector, comprising a 0.51 µm thick crystalline Si layer on sapphire, had only 0.6% efficiency at $\lambda=0.85$ µm, with a response to pulse excitation that had full width at half maximum (FWHM) of 5.7 ps for red light excitation. See C.-C. Wang et at., *Applied Physics Letters*, Vol. 64 (26), p. 3578. Clearly, the prior art detector had high speed but very low efficiency, and thus would not have been suitable for many potential applications. M. Y. Liu et al., *Applied Physics Letters* Vol. 65(7), p. 887 (1994) suggest that the responsivity of a SMS Si-based photodetector can be improved, without lowering of device speed, by means of a quarter-wave stack reflector underneath the active layer, and an antireflection coating on the active layer. These suggested modifications would result in a relatively complex, and therefore costly, structure.

In view of the potential advantages of a Si-based photodetector, it would be highly desirable to have available a Si-based photodetector of simple structure that can have both relatively high quantum efficiency and fast response. This application discloses such a photodetector.

Glossary

By a "textured" surface we mean herein a surface that exhibits surface features, typically substantially randomly distributed features, so as to (randomly or pseudo-randomly) scatter radiation of a predetermined wavelength $\lambda$ incident on the surface. Associated with such a surface are statistical measures of the surface features, including an average feature size. The average feature size typically can be determined from, e.g., a scanning electron microscope (SEM) micrograph of the surface.

SUMMARY OF THE INVENTION

In a general aspect the invention is embodied in an article comprising an improved Si-based photodetector. More specifically, the photodetector comprises a crystalline Si (silicon) layer disposed on a dielectric material, and spaced apart first and second contacts to the Si layer. The article also comprises a voltage source for applying a bias voltage between said first and second contacts, and apparatus (typically intergrated receiver circuitry) that is responsive to the current between said first and second contacts. The Si layer has a major surface, and the current is responsive to electromagnetic radiation of wavelength $\lambda$ that is incident on the major surface and transmitted therethrough.

Significantly, the thickness t of the crystalline Si layer is less (typically substantially less) than the absorption length $\alpha^{-1}$ in crystalline Si of the radiation of wavelength $\lambda$, the dielectric material has a refractive index that is less than the refractive index of crystalline Si at $\lambda$, and at least a portion of the major surface is textured such that the propagation direction of radiation of wavelength $\lambda$ that is incident on the textured surface is substantially randomized.

In an exemplary embodiment the photodetector is a MSM photodetector, and the first and second contacts are disposed on the major surface of the Si layer. In another exemplary embodiment the photodetector is a p-n junction device, with a first portion of the Si layer being n-type and a second portion being p-type, with the first and second contacts contacting the first and second portions, respectively.

In articles according to the invention, the substantially randomized radiation that results from transmission through the textured surface is substantially confined in the Si layer, resulting in an effective path length in the Si layer that can be substantially longer than the thickness of the Si layer. Consequently, detectors according to the invention can at the same time have relatively high (e.g., $\geq 20\%$) quantum efficiency and speed (e.g., $\geq 1$ Gb/s).

DETAILED DESCRIPTION

The above-mentioned problems with prior art Si-based photodetectors are overcome in photodetectors that, inter alia, are processed to have a textured major surface. The textured surface results in substantial randomization of the propagation direction of the radiation in the Si layer of the detector, and consequently in significantly increased propagation length of the radiation in the Si layer, as compared to analogous prior art detectors with non-textured surface.

U.S. Pat. No. 5,506,419, filed Nov. 10, 1994 by B. F. Levine et at., discloses a quantum well infrared photodetector (QWIP) that has a surface that is patterned to pseudo-randomly reflect radiation. See also G. Sarusi et al., *Applied Physics Letters*, Vol. 64(8), p. 960, February 1994, which discloses such QWIPs. Si-based solar cells with textured surface are also known. See, for instance, T. Tiedje et al., *IEEE Transactions on Electron Devices Vol. ED* 31(5), p. 711.

Figure 1:
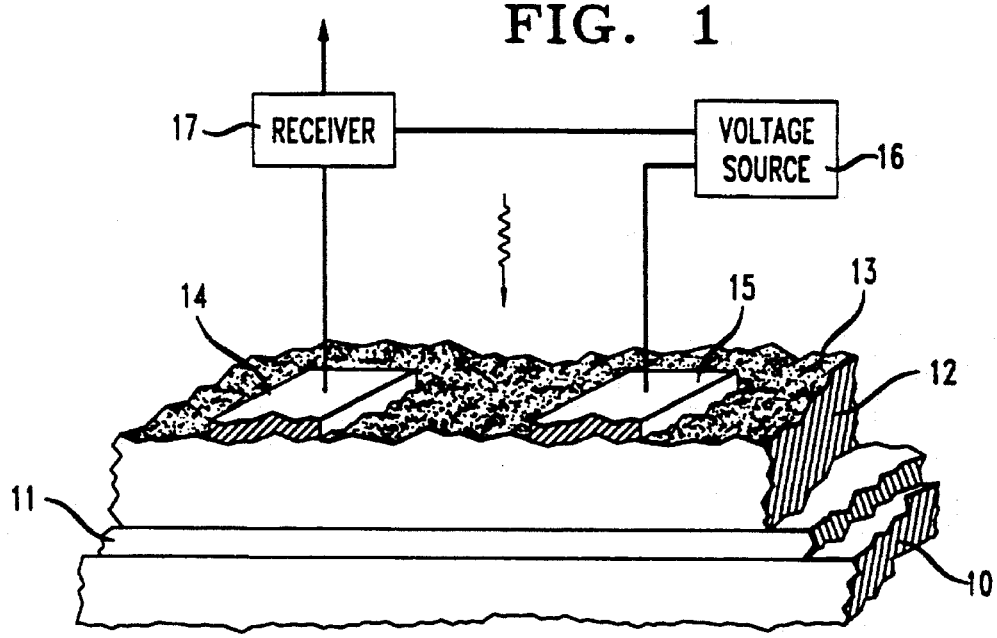
FIG. 1 schematically depicts an article according to the invention.

I will next describe a particular embodiment of the invention, namely, a MSM Si-based photodetector. A portion of the exemplary photodetector is schematically depicted in FIG. 1, wherein numerals 10–12 refer, respectively, to a substrate (typically Si), a dielectric (typically $SiO_2$) layer, and a high quality crystalline Si (active) layer. Si-on-insulator (SOI) wafers of the type used to make the device shown in FIG. 1 are well known and are commercially available. The buried $SiO_2$ layer is exemplarily about 0.4–1 μm thick, and the thickness t of layer 12 is selected to be substantially less than the relevant absorption length $\alpha^{-1}$ in Si, typically $<0.5\alpha^{-1}$. In a preferred embodiment t is selected to be approximately equal to the product of hole drift velocity $v_h$ in the lowest electric field region and the maximum response time τ of the device. The former typically is about $10^6$ cm/s, and for 1 Gb/s operation of the detector τ should be ≦300 ps. The thickness of layer 12 thus exemplarily is selected to be about 3 μm, typically in the range 1.5–5 μm. The doping of the Si active layer is advantageously selected such that the layer is substantially depleted at anticipated bias voltages, e.g., at CMOS bias voltage levels of 3.5–5 V. Exemplarily the active layer doping is $\leq 10^{16}$ cm$^{-3}$, exemplarily about $10^{15}$ cm$^{-3}$ p-type.

Those skilled in the art will recognize that appropriate choice of active layer thickness and doping can substantially solve the above referred-to slow diffusion problem, since Si layer 12 will typically be depleted, and since carriers that are photogenerated in Si substrate 10 can not diffuse across insulator layer 11. However, such a device, without textured surface 13, would still have quite low quantum efficiency, exemplarily only about 6%. I have discovered that the quantum efficiency can be substantially increased by appropriate texturing of surface 13. The basis of the increase of efficiency η is light trapping inside the Si active layer 12 due to total internal reflection. It will be noted that both air and $SiO_2$ have substantially smaller refractive index than crystalline Si.

A textured Si surface suitable for devices according to the invention can be produced, for instance, by plasma etching. For instance, a suitable textured surface results when about 1 μm of layer 12 is removed, using a helicon high density plasma source, with the highly $Si/SiO_2$ selective gas mixture of 69% HBr, 22% He, 5.5% $O_2$ and 3.5% $SF_6$ at the pressure of 5 mTorr, a RF source power of 2500 W and a chuck bias of 50 V. The resulting etched Si surface had a black velvet non-reflecting appearance. SEM of the etched surface showed that the surface features had average size of about 0.1 μm, corresponding to about a half wavelength of the radiation (λ=0.85 μm in vacuum) in the Si. Desirably, the average feature size is in the range 0.2λ/2n to 5λ/2n, where n is the refractive index of crystalline Si for radiation of (vacuum) wavelength λ. Preferably the average feature size is (λ/2n)±50%.

Figure 4:
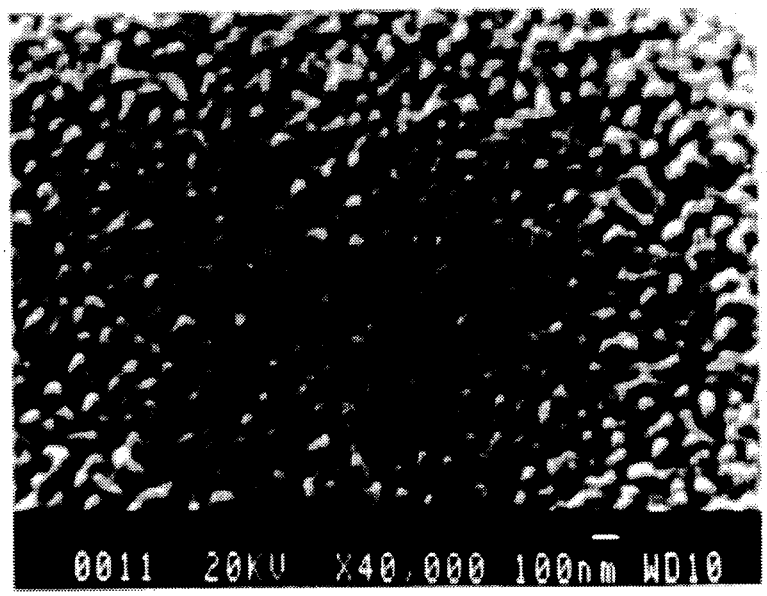
FIG. 4 shows an SEM micrograph of a textured surface.

In the exemplary embodiment the textured surface had, in SEM micrographs, a "hill and dale" appearance, with substantially rounded "hills", as can be seen from FIG. 4.

Figure 2:
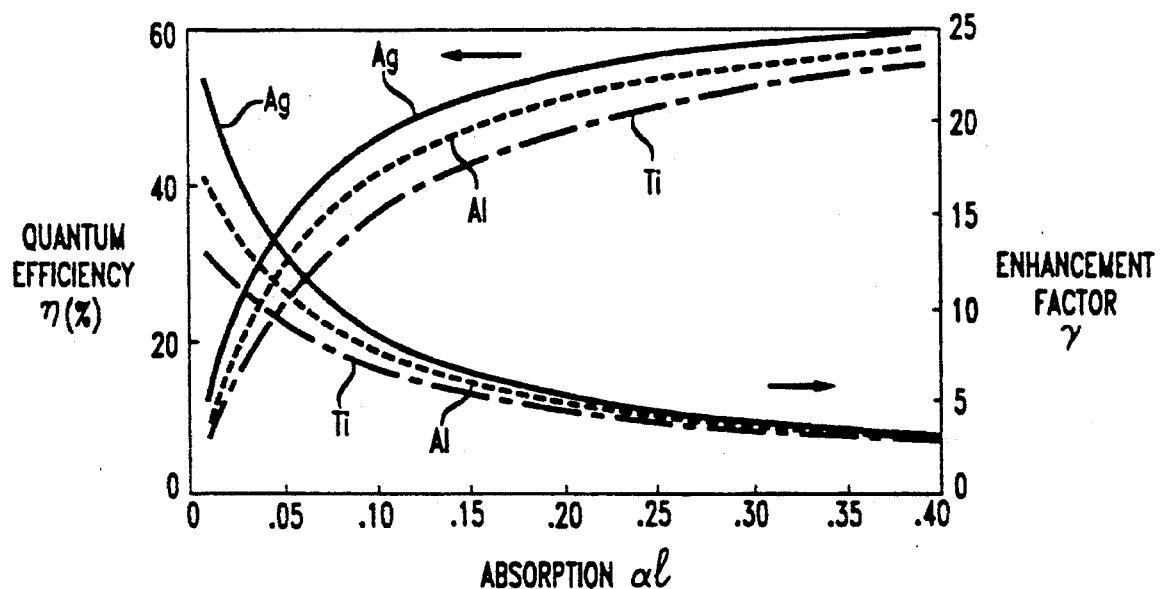
FIG. 2 shows exemplary results on absorption vs. quantum efficiency and enhancement factor for a photodetector according to the invention.

The absorption enhancement that results from provision of a textured surface 13 can be readily calculated by means of the statistical optic theory of E. Yablonovitch, *J. of the Optical Society of America*, Vol. 72, pp. 899–907 (1982), incorporated herein by reference. FIG. 2 shows results of such a calculation, for 1 μm wide interdigitated metal electrodes on the surface, with 4 μm spacing between the electrodes. Reference numerals 14 and 15 in FIG. 1 designate the electrodes, and numerals 16 refer to an appropriate bias voltage source and receiver, respectively. Voltage source and receiver can be conventional. FIG. 1 of the previously cited C.-C. Wang paper shows an exemplary set of interdigitated electrodes in plan view, and the previously cited Yamanaka paper (incorporated herein by reference) shows, inter alia, receiver circuitry and an integrated array of photodetectors and receivers.

FIG. 2 shows that quite larger values of η can be attained even for rather small values of αt. The figure also shows that η also depends on the composition of the electrodes, with Ag yielding the highest values and Ti the lowest, with Al being intermediate. FIG. 2 also shows the quantum efficiency enhancement $\lambda=\eta/\eta_o$, where $\eta_o$ is the single pass efficiency through Si thickness t.

On the above described textured surface of the exemplary wafer was deposited a Ti layer, which was then patterned by conventional means into 100 μm square interdigitated MSM patterns with 1.6 μm finger linewidths and 4.4 μm finger spacings. Ti was chosen for the metal contacts to provide a stringent test, since it has relatively low reflectivity. Other contact metals can be used. The same electrode patterns were also formed on an untextured portion of the same wafer, to provide side by side comparison. The completed detectors were mounted in a high speed 50 ohm transmission line microwave mount. Conventional means were used to apply a bias voltage between the electrodes, and the responsivity R of the detectors was measured using a calibrated GaAs laser operating at λ=0.88 μm. An exemplary detector according to the invention gave a value of R=0.19 A/W at a bias voltage $V_b$=5 V, and an analogous detector with untextured surface 13 had a (normalized to t=3 μm) responsivity of only 0.053 A/W. These values of responsivity correspond to η of 27% and 7.4%, respectively, indicating substantial improvement in η of the (unoptimized) exemplary detector according to the invention.

Figure 3:
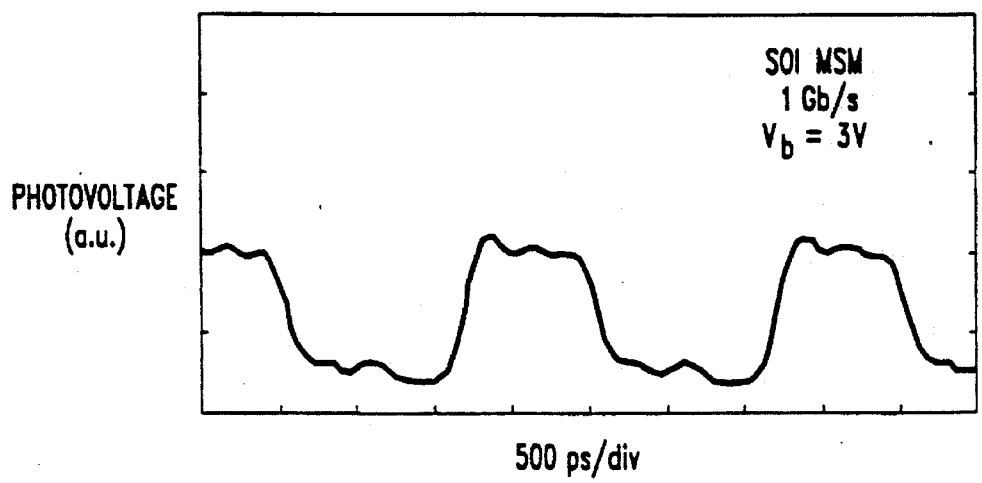
FIG. 3 shows performance data for an exemplary photodetector according to the invention.

The speed of the above described exemplary SMS detector according to the invention was tested with a 1 Gb/s square wave laser signal. Exemplary results are shown in FIG. 3. The rise and fall times are about 200 ps. The bumps on the trace are unrelated to detector performance.

Figure 5:
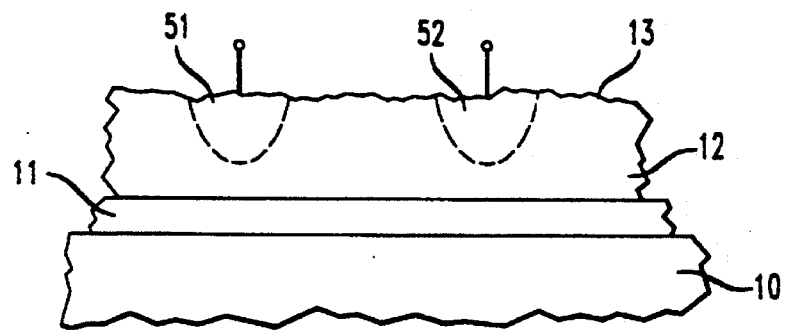
FIGS. 5 and 6 schematically depict further exemplary photodetectors according to the invention.
Figure 6:
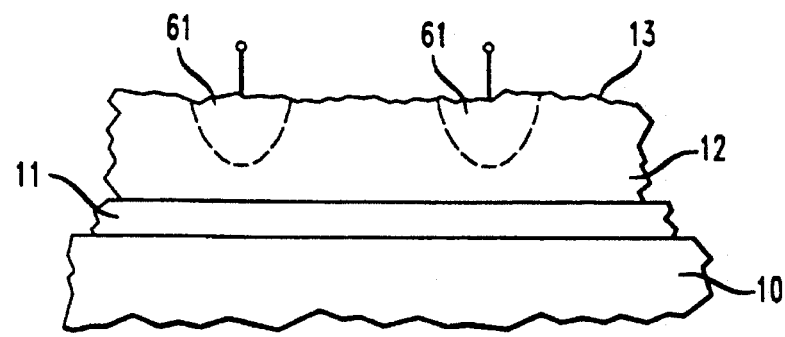

Those skilled in the an will appreciate that the invention can be embodied not only in MSM-type photodetectors but in substantially any Si-based photodetector, for instance, p-i-n-type photodetectors and photoconductor-type detectors. FIGS. 5 and 6 schematically depict a portion of a p-i-n-type photodetector and of a photoconductor-type photodetector. In the former numerals 51 and 52 refer to p- and n-doped regions, whereas in the latter regions 61 are of the same conductivity type, exemplarily p-type. The above discussed selection criteria for, e.g., thickness and doping of the active layer 12, and average feature size of textured surface 13 typically apply to all embodiments of the invention. Contacts are conventional and may be ohmic or non-ohmic.

Although the invention can be embodied in an article that comprises a discrete photodetector according to the invention, the invention is most advantageously embodied in an article that comprises an integrated array of photodetectors and associated circuitry. Such integrated arrays can be used, for instance, in optical interconnect apparatus or optical links. See, for instance, FIG. 2 of the previously referenced Yamanaka paper. Furthermore, a detector according to the invention, with integrated associated circuitry, can be advantageously used, for instance, on subscriber premises for fiber-to-the-home broadband communication systems. For all these applications the potentially relatively low cost and high functionality of integrated Si-based photodetector/circuitry combinations will be of advantage.

I claim:

1. An article comprising a Si-based photodetector comprising a) a crystalline Si layer disposed on a dielectric material, said Si layer having a major surface; and b) spaced apart first and second contacts to the Si layer; and the article also comprises c) a voltage source for providing a bias voltage between said first and second contacts, and a receiver that is responsive to a current between said first and second contacts, said current being responsive to electromagnetic radiation of wavelength $\lambda$ incident on said major surface;

CHARACTERIZED IN THAT d) the thickness t of said crystalline Si layer is less than an absorption length $0.5\ \alpha^{-1}$ in crystalline Si of said radiation of wavelength $\lambda$, and is in the range 1.5–5 μm;

e) said dielectric material has a refractive index that is less than a refractive index of crystalline Si; and f) at least a portion of said major surface is textured, such that said radiation of wavelength $\lambda$ is transmitted through said portion of the surface in substantially random directions, wherein associated with said at least portion of the surface is an average feature size, said average feature size being in the range $0.2(\lambda/2n)$ to $5(\lambda/2n)$, where n is the refractive index of crystalline Si for radiation of wavelength $\lambda$.

2. Article according to claim 1, wherein said crystalline Si layer comprises Si with dopant concentration $<10^{16}\ cm^{-3}$.

3. Article according to claim 1, wherein said first and second contacts are metal contacts.

4. Article according to claim 1, wherein said first and second contacts comprise, respectively, a region of a first conductivity type and a region of a second conductivity type in the crystalline Si layer.

5. Article according to claim 1, wherein each of said first and second contacts comprise a region of a first conductivity type in the crystalline Si layer.

6. Article according to claim 1, wherein each of said photodetector and receiver is disposed on a common Si body.

7. Article according to claim 6, the article comprising a plurality of said photodetectors disposed on a common Si body.

8. Article according to claim 7, wherein associated with each photodetector of said plurality is a receiver disposed on said common Si body.

* * * * *